(12) United States Patent
Mashino (10) Patent No.: US 7,114,251 B2
(45) Date of Patent: Oct. 3, 2006

(54) METHOD OF PRODUCING OF CIRCUIT BOARD; FOR SEMICONDUCTOR DEVICE

(75) Inventor: Naohiro Mashino, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 476 days.

(21) Appl. No.: 10/145,021

(22) Filed: May 15, 2002

(65) Prior Publication Data

US 2002/0170173 A1 Nov. 21, 2002

(30) Foreign Application Priority Data

May 21, 2001 (JP) .............................. 2001-151027

(51) Int. Cl.
*H05K 3/02* (2006.01)
*H05K 3/42* (2006.01)

(52) U.S. Cl. ........................... 29/852; 29/846; 29/847; 427/97; 205/123

(58) Field of Classification Search .......... 29/829–834, 29/846–847, 852; 257/758–767; 438/625–628, 438/687, 660, 637–638, 691; 205/137, 123; 174/255–262; 427/97, 98.1
See application file for complete search history.

(56) References Cited

U.S. PATENT DOCUMENTS

| | | | |
|---|---|---|---|
| 4,766,017 A | | 8/1988 | Heymann et al. |
| 5,354,712 A | * | 10/1994 | Ho et al. ..................... 438/643 |
| 5,798,298 A | | 8/1998 | Yang et al. |
| 5,824,599 A | * | 10/1998 | Schacham-Diamand et al. .......................... 438/678 |
| 5,893,752 A | * | 4/1999 | Zhang et al. ................ 438/687 |
| 5,969,422 A | * | 10/1999 | Ting et al. ................... 257/762 |
| 6,069,068 A | * | 5/2000 | Rathore et al. ............. 438/628 |
| 6,083,376 A | | 7/2000 | Akram et al. |
| 6,123,825 A | * | 9/2000 | Uzoh et al. ................. 205/183 |
| 6,130,161 A | * | 10/2000 | Ashley et al. .............. 438/687 |
| 6,132,586 A | | 10/2000 | Adams et al. |
| 6,181,012 B1 | * | 1/2001 | Edelstein et al. ........... 257/762 |
| 6,221,769 B1 | | 4/2001 | Dhong et al. |
| 6,242,808 B1 | * | 6/2001 | Shimizu et al. ............. 257/762 |
| 6,300,244 B1 | | 10/2001 | Itabashi et al. |
| 6,316,359 B1 | | 11/2001 | Simpson |
| 6,342,447 B1 | * | 1/2002 | Hoshino ...................... 438/687 |
| 6,418,615 B1 | * | 7/2002 | Rokugawa et al. ........... 29/852 |

(Continued)

FOREIGN PATENT DOCUMENTS

CN 1275802 12/2000

(Continued)

OTHER PUBLICATIONS

Jaafar, M. A. S. et al., "A Plated Through-Hole Interconnect Technology in Silicon," Extended Abstracts, Electrochemical Society, New Jersey, vol. 94/2, p. 490, Jan. 1992.

(Continued)

*Primary Examiner*—Minh Trinh
(74) *Attorney, Agent, or Firm*—Staas & Halsey LLP (57) ABSTRACT

A method of production of a circuit board able to prevent peeling of a conductive layer during polishing of the conductive layer including the steps of forming at least holes in one surface of a substrate; forming a plating power supply layer on the one surface of the substrate, the other surface, the sides, and inner surfaces of the holes; forming a metal layer formed on the one surface of the substrate, the other surface, and the sides and burying the holes by electroplating through the plating power supply layer; and polishing the metal layer to form interconnect patterns comprised of the metal layer buried in the holes.

7 Claims, 10 Drawing Sheets

U.S. PATENT DOCUMENTS

2002/0053730 A1    5/2002    Mashino
2002/0058411 A1    5/2002    Hasegawa et al.

FOREIGN PATENT DOCUMENTS

| | | |
|---|---|---|
| DE | 3150399 A1 | 7/1983 |
| DE | 257 176 | 6/1988 |
| EP | 0712156 A2 | 5/1996 |
| EP | 0 973 195 | 1/2000 |
| EP | 1061578 A1 | 12/2000 |
| GB | 2344464 | 6/2000 |
| JP | 11-288940 | 10/1999 |
| JP | 11-307633 | 11/1999 |
| JP | 2001-23989 | 1/2001 |
| WO | 99/41434 | 8/1999 |
| WO | 01/52307 | 7/2001 |

OTHER PUBLICATIONS

Database Inspec Online, "Carbon as a Barrier for the Outdiffusion of Cu," The Institution of Electrical Engineers, Stevenage, Great Britain, vol. 54, No. 25, Jun. 19, 1989.

European Search Report dated Dec. 23, 2005 for European App. No. 02291236.4.

* cited by examiner

METHOD OF PRODUCING OF CIRCUIT BOARD; FOR SEMICONDUCTOR DEVICE

BACKGROUND OF THE INVENTION

1. Field of the Invention

The present invention relates to a method of production of a circuit board, a semiconductor device, and a plating system, more particularly relates to a method of production of a circuit board for mounting a semiconductor chip, a semiconductor device comprised of this circuit board and a semiconductor chip etc. mounted on it, and a plating system able to be used for that method of production.

2. Description of the Related Art

In recent years, three-dimensional mounting structures comprised of a plurality of vertically stacked semiconductor chips have been proposed.

These are comprised for example by mounting a semiconductor chip on a circuit board by flip-chip bonding etc. to obtain a unit component and stacking a plurality of these to obtain a three-dimensional module.

This circuit board is produced by forming interconnects comprised of copper etc. on a glass substrate or silicon substrate.

If the pitch of the bumps of the semiconductor chip mounted by flip-chip bonding on interconnects of the circuit board becomes less than for example 10 μm, the flatness of the surface of the circuit board becomes important. From this viewpoint, the interconnects of a circuit board have been formed by forming holes or grooves in the substrate and burying them with a copper layer etc., that is, the use of the damascene process.

To form interconnects on a substrate by the damascene process, holes or grooves corresponding to the desired interconnect patterns are formed in one surface of the substrate, a plating power supply layer (plating current supply layer) is formed by sputtering, electroless plating, etc., a conductive layer comprised of copper etc. is buried in the holes or grooves by electroplating through this plating power supply layer, then the conductive layer at the portions other than the holes and grooves is removed by polishing, whereby interconnects of the desired patterns comprised of the parts of the conductive layer buried in only the holes or grooves are formed.

In the past, the conductive layer was formed only on one surface of the substrate by electroplating. Further, in the case of electroplating, it is necessary to supply a plating current between a power supply electrode serving as an anodic electrode provided in a plating bath and the plating power supply layer of the substrate serving as the cathodic electrode, so the plating was performed in the state with the power supply electrode fixed to a predetermined position of the plating power supply layer.

In the method of production of a circuit board of the past, however, since the conductive layer was formed on only one surface of the substrate and was not formed on the other surface or the sides of the substrate, the interface between the conductive layer and the underlying plating power supply layer was liable to become exposed at the periphery of the substrate. Further, since the power supply electrode of the plating system was fixed to part of the periphery of the plating power supply layer of the substrate, the conductive layer was not formed at the portion contacted by the power supply electrode. Even near it, the conductive layer was liable to not be formed since the plating current density etc. fluctuated. That is, electroplating did not occur at the portion of the plating power supply layer contacted by the power supply electrode of the substrate or its vicinity, the plating power supply layer was exposed, and as a result the interface between the conductive layer and the plating power supply layer became exposed.

In this way, in the method of production of a circuit board of the past, the interface between the conductive layer and the underlying plating power supply layer was liable to be exposed at the periphery of the substrate or the portion contacted by the power supply electrode or its vicinity. If polishing the conductive layer by for example chemical mechanical polishing (CMP) in this state, there was the problem that the CMP polishing material would invade the interface between the conductive layer and plating power supply layer and thereby cause the conductive layer to peel off and prevent the efficient formation of buried interconnects.

SUMMARY OF THE INVENTION

An object of the present invention is to provide a method of production of a circuit board able to prevent peeling of the conductive layer during polishing of the conductive layer, a plating system, and a semiconductor device comprised of a circuit board produced by this method of production and a semiconductor chip mounted on the same.

To achieve this object, according to a first aspect of the present invention, there is provided a method of production of a circuit board comprising the steps of forming at least holes in one surface of a substrate; forming a plating power supply layer on that one surface of the substrate, the other surface and sides, and inner surfaces of the holes; forming a metal on the one surface of the substrate and the other surface and sides and burying the holes layer by electroplating through the plating power supply layer; and polishing the metal layer to form interconnect patterns comprised of the metal layer buried in the holes.

According to this aspect of the present invention, by forming holes in one surface of the substrate and forming a metal layer serving as a continuous film extending over the one surface of the substrate, the other surface and sides, and the inner surfaces of the holes, that is, over the entire surface of the substrate, by electroplating through a plating power supply layer and polishing the metal layer, interconnect patterns comprised of the metal layer buried in the holes are formed.

By forming the metal layer serving as the continuous film over the entire surface of the substrate in this way, there is no longer any exposed portion of the underlying plating power supply layer, that is, exposed portion of the interface of the metal layer and plating power supply layer. Therefore, it is possible to prevent peeling of the metal layer caused by the polishing material used invading the interface when polishing the metal layer by for example CMP.

In the step of forming the metal layer, preferably the power supply electrode for supplying the plating current to the plating power supply layer is connected to the plating power supply layer of the substrate and the position of the connection of the power supply electrode is changed during plating.

When forming a metal layer by electroplating, it is necessary to perform the plating while supplying a plating current between the power supply electrode serving as the anodic electrode provided in the plating solution and the plating power supply layer of the plated object (i.e. the object for plating, or a substrate) serving as the cathodic electrode. In the past, generally, the power supply electrode was fixed to the periphery of the plating power supply layer of the plated object.

At this time, the portion of the substrate which the power supply electrode contacts is not plated. Alternatively, even in its vicinity, good plating is no longer performed since the current density deviates from its predetermined value etc. As a result, as explained above, the metal layer is liable to peel off in the step of polishing the metal layer.

As opposed to this, according to a preferred embodiment of the present invention, since the plating is performed while changing the position where the power supply electrode contacts the plating power supply layer, there is no longer any portion where the metal layer is not formed due to contact of the power supply electrode and a continuous plating film is formed over the one surface of the substrate and over the other surface and sides, that is, the entire surface of the substrate. Due to this, it becomes possible to prevent peeling of the metal layer occurring due to the power supply electrode contacting the substrate.

Further, in the above method of production of a circuit board, preferably there is further a step of roughening the one surface of the substrate before the step of forming the holes in the substrate. Further, in the above method of production of a circuit board, preferably the step of forming the holes in the substrate includes a step of forming dummy holes at least at a periphery of the substrate.

Since the metal layer burying the holes of the substrate is formed with an uneven distribution of thickness to a certain extent due to the uneven flatness of the substrate and the uneven formation on the substrate, even if forming the metal layer continuous on the entire surface of the substrate, the portions of small thickness of the metal layer are polished faster, so those portions of the substrate are exposed first in the polishing. At that time, the section of the plating power supply layer and metal layer are exposed on the substrate and the polishing material invades the interface between these layers, so the plating power supply layer or metal layer may peel off from the substrate.

According to the present invention, however, the surface of the substrate formed with the holes is roughened by forming fine roughness etc. before forming the holes in the substrate, so the plating power supply layer is formed meshed with the same. The bonding between the substrate and the plating power supply layer can be improved by the resultant anchor effect.

Further, by forming dummy holes of a shallower depth than the regular holes at an area where the regular holes are not formed, for example, the periphery of the substrate, in the step of forming the holes or the steps before or after it, it is possible to improve the bonding of the substrate with the plating power supply layer by a similar anchor effect to the above.

To achieve the above object, according to a second aspect of the present invention, there is provided a plating system provided with a vessel for holding a plating solution and a rotatable power supply electrode arranged in the vessel and electrically connected to one surface and the other surface of a plated object, wherein the plated object is made to move by rotation of the power supply electrode during the plating so as to change the portion which the power supply electrode of the plated object contacts.

The plating system of the present invention has for example two rows of pluralities of rod-shaped power supply electrodes arranged so as to be able to supply plating current to the front and back surfaces of the plated object. The power supply electrodes are designed to rotate. Further, by arranging the plated object between the two rows of the pluralities of rod-shaped power supply electrodes and rotating the power supply electrodes, the plated object can move in a state with the plating power supply layer and the power supply electrodes in contact with each other.

Due to this, since plating current is supplied while the power supply electrodes contact different portions on the plated object while plating the metal layer, there are no longer portions where the metal layer is not formed due to contact with the power supply electrodes and the metal layer is formed continuously over the entire surface of the substrate. By using such a plating system, it is possible to easily work the above method of production of a circuit board.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

First Embodiment

A method of production of a circuit board according to a first embodiment of the present invention will be explained first with reference to the schematic sectional views of FIGS. 1A to 1J.

Step 1

Figure 1A:
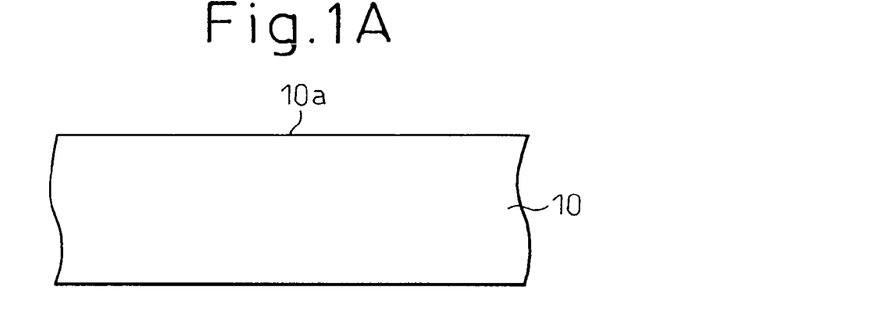
FIGS. 1A to 1J are schematic sectional views of a method of production of a circuit board according to a first embodiment of the present invention.

First, as shown in FIG. 1A, a silicon substrate 10 is prepared as a substrate.

Step 2

Figure 1B:
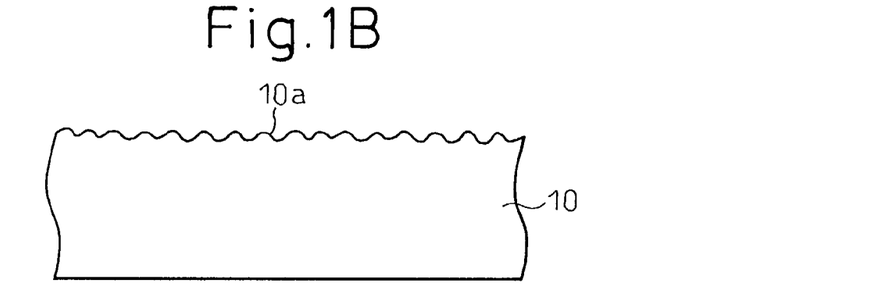

Next, as shown in FIG. 1B, one surface 10a of the silicon substrate 10 is roughened. This roughening may be performed by for example plasma etching using a fluorine-based or other gas, treatment by a strong alkali such as caustic soda (NaOH) or potassium hydroxide (KOH), sandblasting by blasting grains of sand by a high pressure, or polishing by sandpaper etc. By performing such treatment, fine roughness is formed on the one surface 10a of the silicon substrate 10, so the bonding between the silicon substrate 10 and the layer formed in later steps can be improved by the anchor effect.

Step 3

Figure 1C:
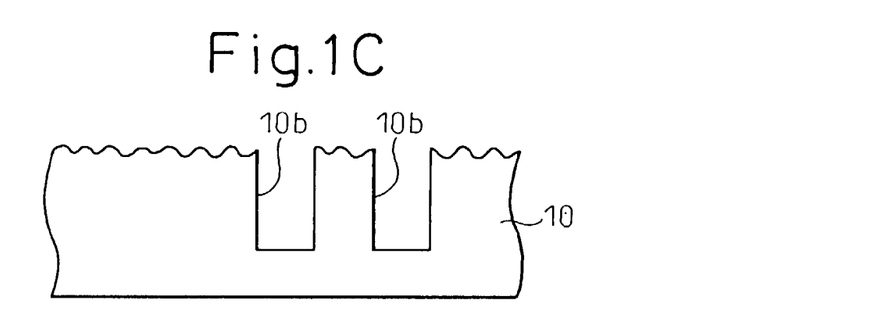

Next, as shown in FIG. 1C, the one surface 10a of the silicon substrate 10 is treated by plasma etching using a fluorine-based or other gas, chemical etching using a chemical, or sandblasting so as to form holes 10b not passing through the silicon substrate 10. The diameter of the holes 10b is for example about 5 to 100 μm, while the depth is 5 to 500 μm or so.

Figure 1D:
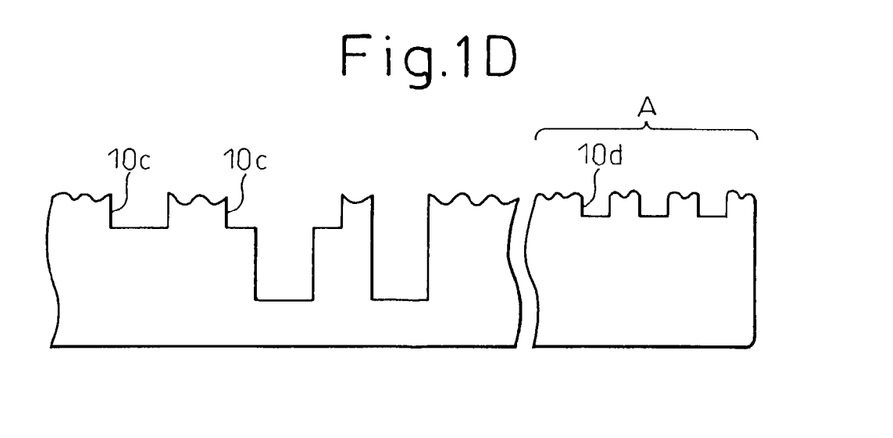

Next, as shown in FIG. 1D, interconnect grooves 10c are formed in the one surface 10a of the silicon substrate 10. Some of the interconnect grooves 10c connect with the holes 10b, while others are isolated from the holes 10b. The interconnect grooves 10c like the holes 10b, are formed by plasma etching, chemical etching, or sandblasting. The width of the interconnect grooves 10c is for example 1 to 100 μm or so, while the depth is 5 to 200 μm or so. Note that it is also possible not to form the interconnect grooves 10c.

At the step of forming the holes 10b, the step of forming the interconnect grooves 10c, or the steps before and after these, dummy holes 10d of a narrower width and a shallower depth than the holes 10b or interconnect grooves 10c are formed at areas not formed with holes 10b or the interconnect grooves 10c for example, the periphery A of the silicon substrate 10 shown in FIG. 1D. Note that in this embodiment, the example is shown of formation of the dummy holes 10d by the step of forming the holes 10b. For example, these may be formed by sandblasting. Further, it is possible to form the dummy holes 10d at areas not formed with the holes 10b or interconnect grooves 10c other than the periphery A.

Step 4

Figure 1E:
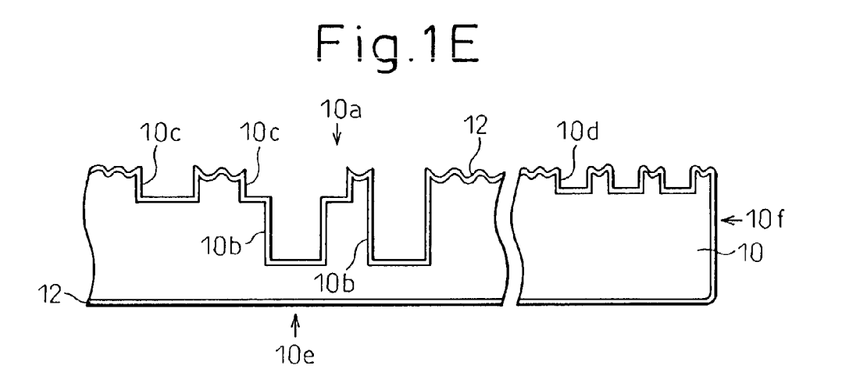

Next, the silicon substrate 10 is thermally oxidized to form a silicon oxide film of a thickness of for example 5 to 1500 nm. At that time, as shown in FIG. 1E, the silicon oxide film 12 is formed at the one surface 10a of the silicon substrate 10, the inner surfaces of the holes 10b, interconnect grooves 10c, and dummy holes 10d, the other surface 10e of the silicon substrate 10, and the sides 10f of the silicon substrate 10. Note that instead of thermal oxidation, it is also possible to form the silicon oxide film 12 by chemical vapor deposition (CVD). Further, it is preferable to form the silicon oxide film 12 as thick as possible.

Figure 1F:
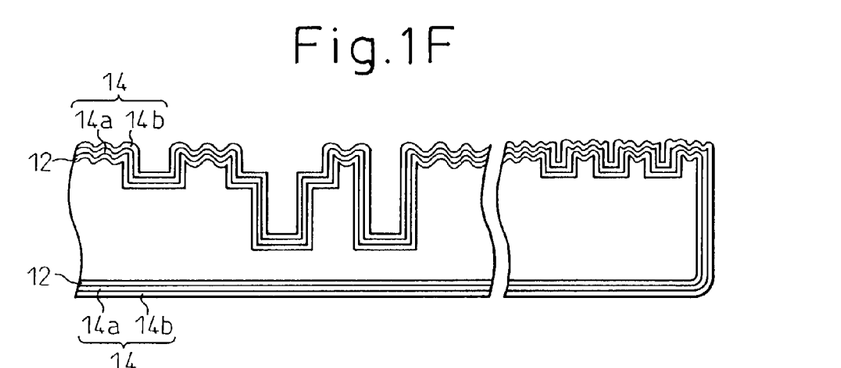

Next, as shown in FIG. 1F, a nickel (Ni) layer 14a of a thickness of for example 0.1 to 5 μm is formed by electroless plating on the silicon oxide film 12 formed on the one surface 10a of the silicon substrate 10 and the other surface 10e and sides 10f, that is, the entire surface of the silicon substrate 10. At this time, the areas of the silicon substrate where the holes 10b or interconnect grooves 10c are not formed are roughened and, in addition, the dummy holes 10d are formed, so the bonding between the silicon oxide film 12 and the Ni layer 14a, that is, the bonding between the silicon substrate 10 and the Ni layer 14a, is improved by the anchor effect.

Step 5

Next, a gold (Au) or copper (Cu) layer 14b of a thickness of for example 1 μm is formed by electroless plating or electroplating on the Ni layer 14a formed on the entire surface of the silicon substrate 10.

When the Au layer 14b is used as a plating power supply layer, a barrier layer of Ni or other metal may be formed on the Au layer 14b so that Au is prevented from diffusing into Cu layers 16 and 18 which will be next formed.

By the above steps, holes 10b or interconnect grooves 10c are formed in the silicon substrate 10 and a plating power supply layer 14 comprised of an Ni layer 14a and Au layer 14b is formed on this through the silicon oxide film 12. These layers are formed not only on the one surface 10a of the silicon substrate 10, but also on the other surface 10e and the sides 10f.

Explanation of Plating System

Next, a plating system for forming a metal layer on the plating power supply layer 14 in the later step by electroplating will be explained.

Figure 2:
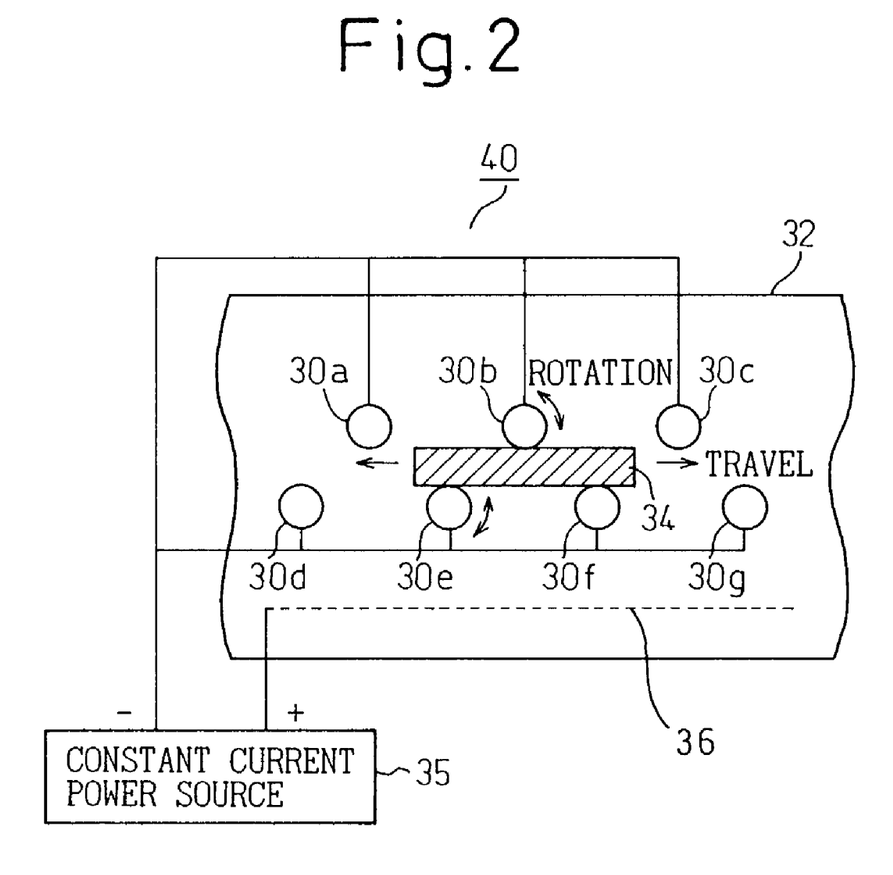
FIG. 2 is a schematic sectional view of a plating system according to a first embodiment of the present invention.

FIG. 2 is a schematic sectional view of a plating system according to an embodiment of the present invention.

The plating system of the present embodiment, as shown in FIG. 2, is arranged so that its power supply electrodes, for example, seven cathodic electrodes (30a to 30g), straddle the plated object (substrate) 34 in a vessel 32 containing the plating solution. The cathodic electrodes (30a to 30g) are comprised of conductive rod-shaped rollers, wheels, or balls and can rotate in a predetermined direction. By the rotation of the cathodic electrodes (30a to 30g), one surface and the other surface of the plated object 34 can be moved to the left and right (see FIG. 2) while in contact with the cathodic electrodes (30a to 30g).

Further, inside the vessel 32 is arranged a mesh-shaped anodic electrode 36 connected to the plus side of a constant current power source 35. On the other hand, the cathodic electrodes (30a to 30g) are connected to the minus side of the constant current power source 35.

The plating system 40 of the present embodiment is configured in this way. Plating current is supplied from the constant current power source 35 between the anodic electrode 36 and the cathodic electrodes (30a to 30g), and a plating layer is formed on the plated object 34 while the plated object 34 moves to the left and right in constant contact with the cathodic electrodes (30a to 30g).

The plating system 40 according to the present embodiment is designed so that not only is a plating layer formed over the one surface of the plated object 34 and the other surface and sides, that is, the entire surface of the plated object 34, but also no portions occur where the plating layer is not formed due to the effect of the power supply electrodes contacting the plated object 34.

That is, if forming a plating power supply layer as a continuous film on the one surface and the other surface and sides of the plated object 34 and plating by the plating system 40 of the present embodiment, the portions where the plated object 34 and power supply electrodes, that is, cathodic electrodes (30a to 30g), contact change during the plating, so there are no longer portions where the plating layer is not formed due to the effects of the power supply electrodes such as the case where the power supply electrodes are fixed to predetermined portions.

Next, a method for forming a copper (Cu) layer, one type of metal layer, on the plating power supply layer 14 of FIG. 1F using the plating system 40 will be explained.

Figure 1G:
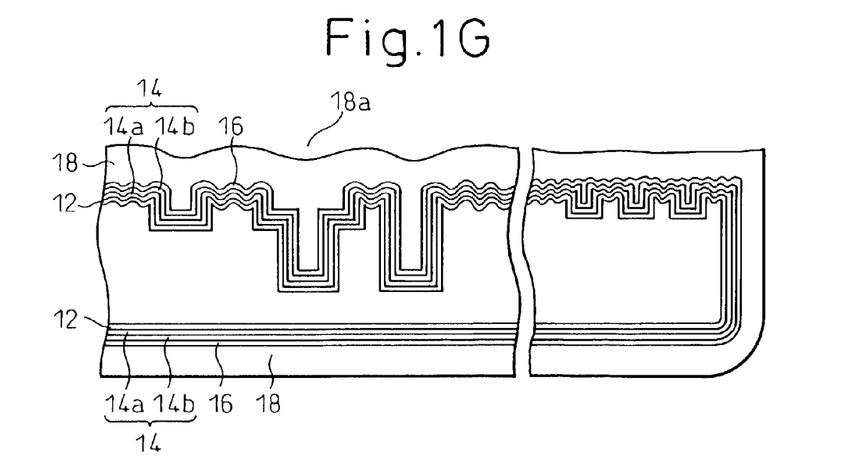

First, as shown in FIG. 1G, a first Cu layer 16 having a thickness of for example 0.5 to 5 μm is formed on an Au layer 14b formed on the entire surface of the silicon substrate 10 by electroplating using the above plating system 40 and for example a plating solution of Melplate Cu390 made by Meltex Inc.

Note that this step may also form the first Cu layer 16 by electroplating using a plating solution of Copper Gleam 125 made by LeaRonal Japan Inc. Further, it is possible to form the first Cu layer 16 by electroless plating. By using such a plating solution, the first Cu layer 16 can be formed with a uniform thickness on the silicon substrate 10 and with a good step coverage in the holes 10b or grooves 10c.

Next, a second Cu layer 18 having a thickness of for example 10 to 150 μm is formed on the first Cu layer 16 formed over the entire surface of the silicon substrate 10 by electroplating using the above plating system and for example a plating solution of Cu-BriteVF made by Ebara-Udylite Co., Ltd. By this, the holes 10b and interconnect grooves 10c in the silicon substrate 10 are buried by the first Cu layer 16 and second Cu layer 18.

By using such a plating solution in the step of forming the second Cu layer 18, the second Cu layer 18 is formed relatively thickly at the bottoms of the recessed portions such as the holes 10b or interconnect grooves 10c of the silicon substrate 10 and formed relatively thinly at the flat parts of the silicon substrate 10 where the holes 10b or interconnect grooves 10c are not formed. Due to this, the holes 10b and interconnect grooves 10c are stably buried by the second Cu layer 18 without the occurrence of porosity, air holes, etc.

When the steps of forming the first Cu layer 16 and the second Cu layer 18 use the above plating system 40, the Cu layers can be formed continuously over the one surface 10a and the other surface 10e and sides 10f of the silicon substrate without the occurrence of portions not formed with Cu layers due to contact of the power supply electrodes fixed to the plating power supply layer 14.

Step 6

Next, a process for removing the second Cu layer 18 or first Cu layer 16 etc. by polishing or etching etc. will be explained.

As shown in FIG. 1G, the second Cu layer 18 formed at the one surface 10a side in the second Cu layer 18 formed on the entire surface of the silicon substrate 10 is affected by the recessed parts such as the holes 10b or interconnect grooves 10c of the foundation. That is, the second Cu layer 18 on the holes 10b or interconnect grooves 10c of the silicon substrate 10 is formed with recessed parts 18a somewhat sunken down from the flat parts of the silicon substrate 10.

Figure 1H:
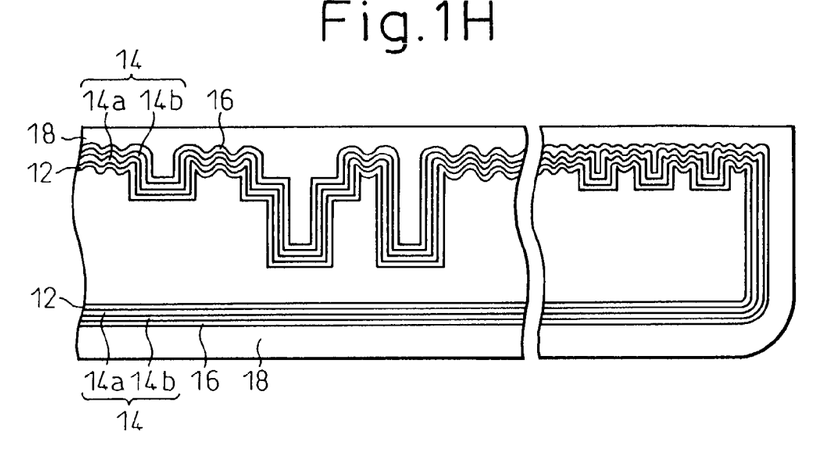

To flatten the recessed parts 18a, first, as shown in FIG. 1H, the second Cu layer 18 is polished by mechanical polishing etc. until the recessed parts 18a of the second Cu layer 18 disappear.

Step 7

Next, the remaining portions of the second Cu layer 18, the first Cu layer 16, the Au layer 14b, and the Ni layer 14a are polished by CMP using the silicon oxide film 12 as a stopper. Note that it is also possible to etch the remaining portions of the second Cu layer 18 and the first Cu layer 16 by a copper chloride aqueous solution, then etch the Au layer 14b and the underlying Ni layer 14a by a potassium ferricyanide aqueous solution.

In the step of polishing the second Cu layer 18 and first Cu layer 16 etc. by CMP, since the second Cu layer 18 and the first Cu layer 16 are formed as continuous films covering all of the surface of the silicon substrate 10 and therefore there is no interface between one layer and another where the polishing material used in the CMP will invade, the second Cu layer 18 and the first Cu layer 16 will no longer peel off.

Figure 1I:
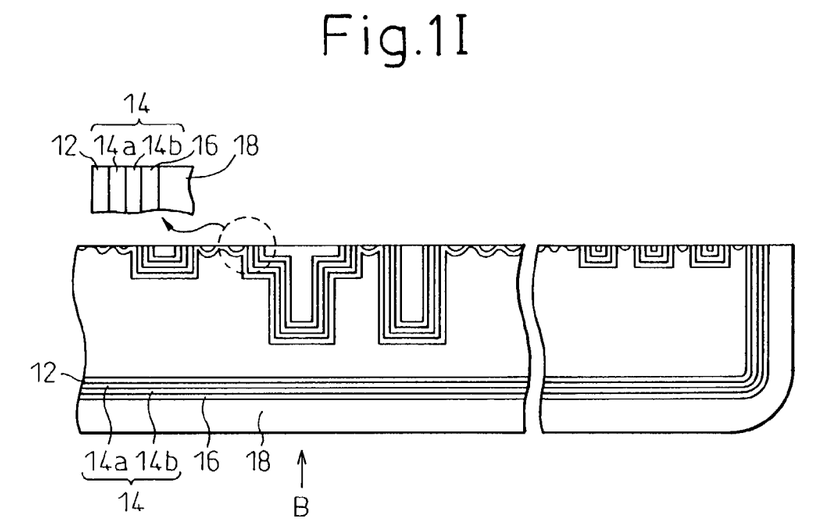

Due to this, as shown in FIG. 1I, the holes 10b and interconnect grooves 10c of the silicon substrate 10 are stably buried with, in the following order, the first Cu layer 16 and the second Cu layer 18 through the Ni layer 14a and the Au layer 14b.

When a metal forming a plating power supply layer is left on the roughened surface after CMP, etching may be conducted to remove the metal.

Figure 1J:
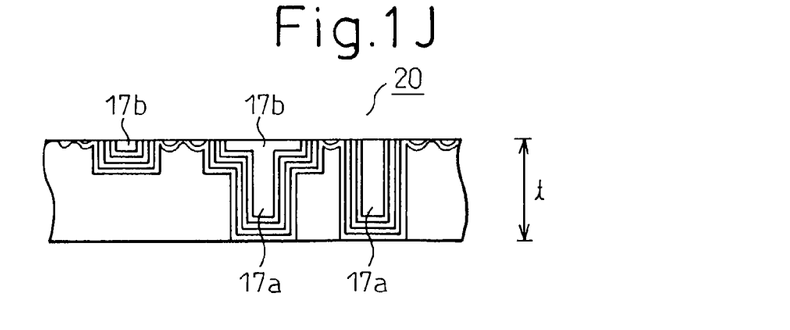

Next, the silicon substrate 10 of FIG. 1I is polished from the side B by back grinding until the Ni layer 14a in the holes 10b is exposed. Due to this, as shown in FIG. 1J, a circuit board 20 is produced formed with connection plugs 17a and interconnects 17b as patterns of the metal layer. At this time, it is preferable to polish to give a thickness of the circuit board 20 of 30 to 500 μm.

The connection plugs 17a and interconnects 17b are comprised of the plating power supply layer 14 comprised of the Ni layer 14a and the Au layer 14b and the first Cu layer 16 and second Cu layer 18 formed by electroplating through the plating power supply layer 14. That is, the connection plugs 17a and interconnects 17b include the low resistance Au layer 14b, so it is possible to lower the resistance.

First Method of Mounting Semiconductor Chip on Circuit Board

FIGS. 3A to 3E are schematic sectional views of a first method of mounting a semiconductor chip on a circuit board produced by the method of production of a circuit board of the present embodiment.

Figure 3A:
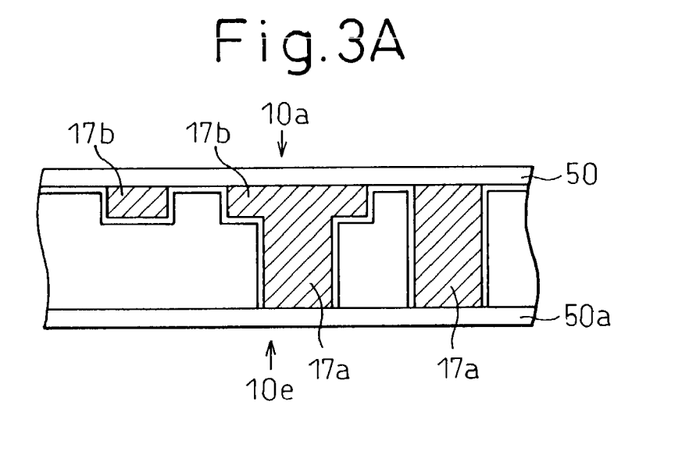
FIGS. 3A to 3E are schematic sectional views of a first method of mounting a semiconductor chip on a circuit board produced by the method of production of a circuit board of the first embodiment of the present invention.

First, as shown in FIG. 3A, $SiO_2$ films 50 and 50a having thicknesses of for example 5 nm to 5 μm are formed by plasma CVD on the one surface 10a and other surface 10e of the circuit board 20 of FIG. 1J. Note that this step is not limited to $SiO_2$ films 50 and 50a. Instead, it is possible to form polyimide films or epoxy resin or other insulating films by coating and heating a coating of polyimide or epoxy resin etc.

Figure 3B:
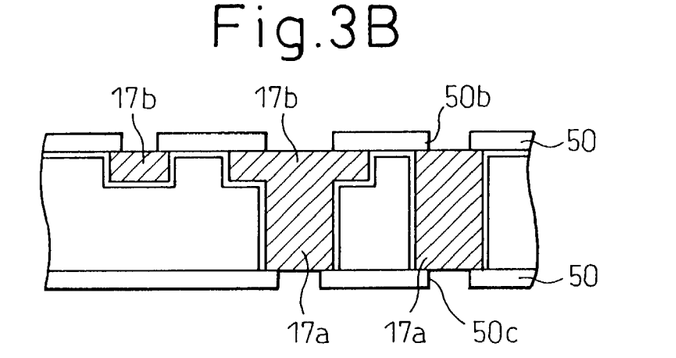

Next, as shown in FIG. 3B, the $SiO_2$ film on the first surface 10a of the circuit board 20 is patterned to form the first openings 50b. Further, the $SiO_2$ film, 50a of the other surface 10e of the circuit board 20 is formed with the second openings 50c by a similar method.

Figure 3C:
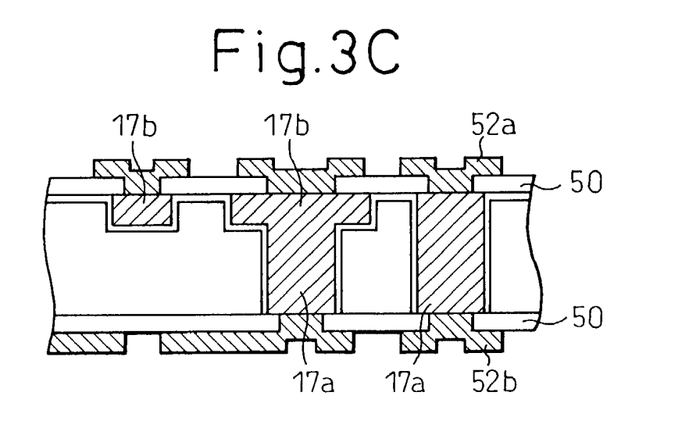

Next, as shown in FIG. 3C, an aluminum (Al) or other metal layer is formed by vapor deposition on the connection plugs 17a, interconnects 17b, and $SiO_2$ films 50 on the one surface 10a of the circuit board 20. Next, the metal layer is patterned to form the top electrode pads 52a. Further, the bottom electrode pads 52b are formed by a similar method on the other surface 10e of the circuit board 20. Note that when patterning the metal layer, it is also possible to form the top electrode pads 52a and bottom electrode pads 52b by trimming the predetermined areas of the metal layer desired to be etched by firing a laser beam. Note that it is also possible to form the Cu layer of the metal layer by plating and to pattern the Cu layer to form the top electrode pads 52a and bottom electrode pads 52b.

Figure 3D:
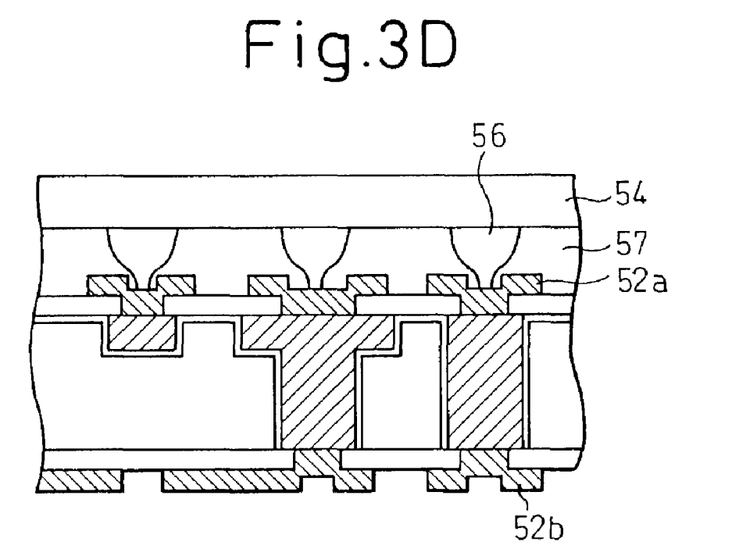

Next, as shown in FIG. 3D, a semiconductor chip 54 provided with stud bumps 56 made of gold etc. is prepared. The stud bumps 56 and the top electrode pads 52a of the circuit board 20 are electrically connected through an anisotropic electroconductive film 57. Note that instead of the semiconductor chip 54 provided with stud bumps 56, it is also possible to prepare a semiconductor chip provided with solder bumps (not shown) and electrically connect the solder bumps and the top electrode pads 52a by flip-chip mounting.

Figure 3E:
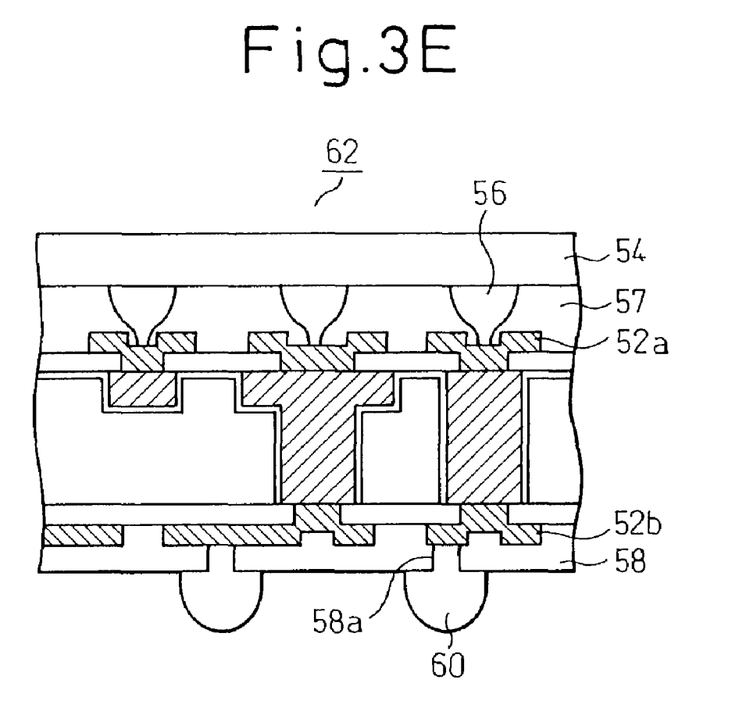

Next, as shown in FIG. 3E, a solder resist film 58 is patterned by screen printing etc. to form third openings 58a so that parts of the bottom electrode pads 52b of the other surface 10e of the circuit board 20 are exposed.

Next, solder bumps 60 electrically connected with the bottom electrode pads 52b through the openings 58a are mounted.

Due to the above, a semiconductor device 62 comprised of the circuit board 20 and the semiconductor chip 54 mounted on it is completed.

Second Method of Mounting Semiconductor Chip on Circuit Board

FIGS. 4A to 4F are schematic sectional views of a second method of mounting a semiconductor chip on a circuit board produced by the method of production of a circuit board of the present embodiment.

Figure 4A:
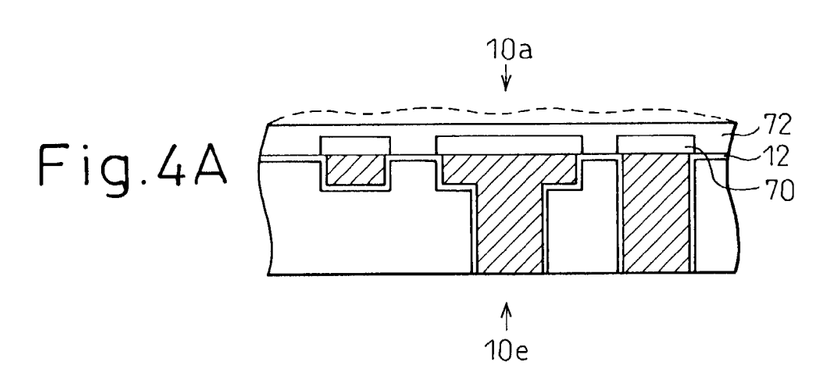
FIGS. 4A to 4F are schematic sectional views of a second method of mounting a semiconductor chip on a circuit board produced by the method of production of a circuit board of the first embodiment of the present invention.

First, as shown in FIG. 4A, a barrier metal layer having a thickness of 50 to 500 nm and made of tantalum, tantalum oxide, etc. is formed by for example sputtering on the surface of the circuit board 20 of FIG. 1J where the connection plugs 17a and interconnects 17b are exposed. Next, the barrier metal layer is patterned to form the barrier metal layer patterns 70 so as to cover the connection plugs 17a and interconnects 17b.

Next, a coating glass film 72 is formed on the silicon oxide film 12 and the barrier metal layer patterns 70. At this time, the coating glass film 72 is formed in a shape having roughness as shown by the broken line in FIG. 4A. Next, as shown in FIG. 4A, the surface of the coating glass 72 is polished by mechanical polishing or CMP to flatten the surface of the coating glass.

Figure 4B:
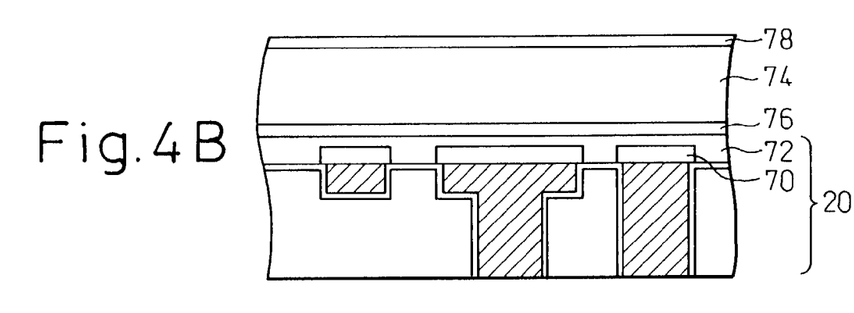

Next, as shown in FIG. 4B, a chip side silicon substrate 74 formed with intermediate insulating films 78 and 76 comprised of $SiO_2$ at its two sides is prepared. The intermediate insulating films 78 and 76 are formed by thermal oxidation of the chip side silicon substrate 74 and have thicknesses of 50 to 1500 nm.

Next, as shown in the same FIG. 4B, the surface of the circuit board 20 on which the coating glass film 72 is formed and the surface of the chip side silicon substrate 74 at the intermediate insulating layer 76 side are arranged to face each other and are annealed at a temperature lower than the melting point of the metal used for the connection plugs 17a and interconnects 17b etc. so as to bond the circuit board 20 and the chip side silicon substrate 74.

Figure 4C:
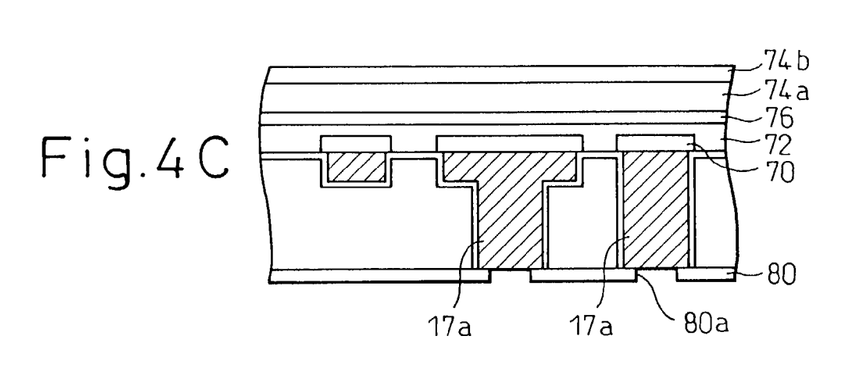

Next, as shown in FIG. 4C, the intermediate insulating film 78 and part of the chip side silicon substrate 74 are polished by CMP to reduce the thickness to for example 0.5 to 100 µm or so. Next, predetermined elements are formed on the front side of the polished chip side silicon substrate to thereby form the chip formation layer 74b on the silicon layer 74a.

Next, a front insulating film 80 comprised of $SiO_2$ is formed on the other surface 10e of the circuit board from which the connection plugs 17a are exposed. This is then patterned to form the first openings 80a so as to expose the connection plugs 17a.

Figure 4D:
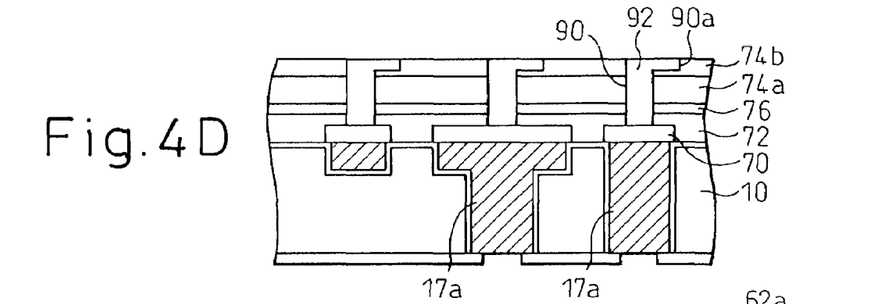

Next, as shown in FIG. 4D, a resist film (not shown) is patterned on the chip formation layer 74b. Using that resist film as a mask, the chip formation layer 74b, silicon layer 74a, intermediate insulating film 76, and coating glass 72 are patterned by plasma etching etc. to form the second openings 90 so that the surface of the barrier metal layer patterns 70 are exposed. Next, the vicinities of the second openings 90 of the chip formation layer 74b are etched to form the recessed parts 90a communicating with the second openings 90.

Next, the second openings 90 and recessed parts 90a are filled with a copper layer etc. to form secondary connection plugs 92. This step may be performed using the known damascene process. At this time, since the interconnect layer connected to the chips formed in the chip formation layer 74b are exposed at the side walls and bottoms of the recessed parts 90a of the chip formation layer 74b, the chips inside the chip formation layer 74 are electrically connected with the secondary connection plugs 92.

Figure 4E:
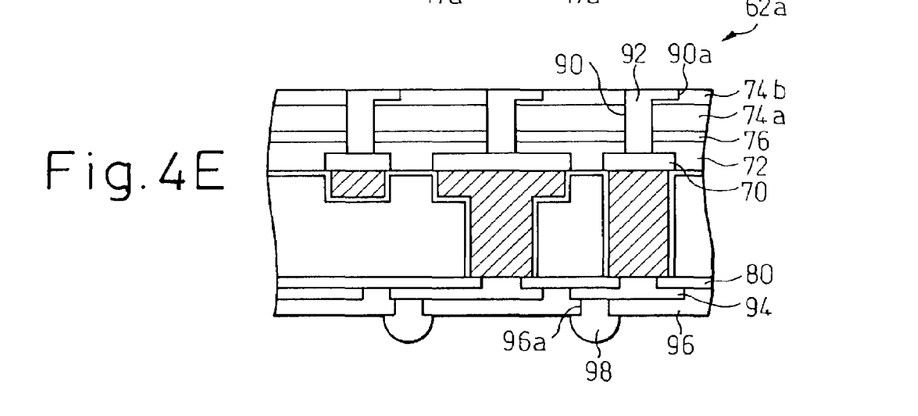

Next, as shown in FIG. 4E, the bottom electrode pads 94 comprised of a copper layer etc. are formed connected to the connection plugs 17a exposed at the other surface of the circuit board.

Next, the solder resist film 96 on the front surface insulating film 80 and the bottom electrode pads 94 is patterned to form the third openings 96a so that parts of the bottom electrode pads 94 are exposed. Next, solder bumps 98 are mounted connected to the bottom electrode pads 94 through the third openings 96a.

When this step ends, while not particularly shown, a plurality of chip formation layers 74b, that is, semiconductor chips, are formed on one circuit board 20.

Figure 4F:
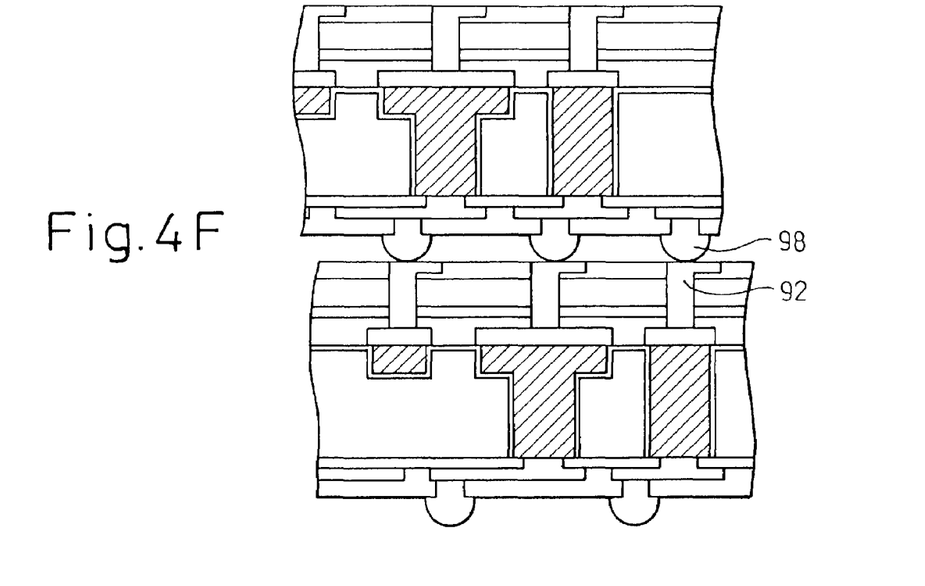

That is, next, the circuit board 20 formed with the plurality of chip formation layers 74b is diced to produced the semiconductor devices 62a. Further, as shown in FIG. 4F, it is also possible to bond the solder bumps 98 and secondary connection plugs 92 and stack a plurality of semiconductor devices vertically to obtain a three-dimensional mounting structure or to use these as individual units.

Second Embodiment

FIGS. 5A to 5D are schematic sectional views of a method of production of an circuit board according to a second embodiment of the present invention.

The method of production of a circuit board according to the second embodiment differs from the method of production of the circuit board according to the first embodiment in the point that not a silicon substrate, but a glass substrate is used as the substrate. In FIGS. 5A to 5D, parts the same as in FIGS. 1A to 1J are assigned the same reference numerals and detailed explanations thereof are omitted. Further, the explanation will be given with reference to steps 1 to 7 explained in the method of production of a circuit board according to the first embodiment.

Step 1

Figure 5A:
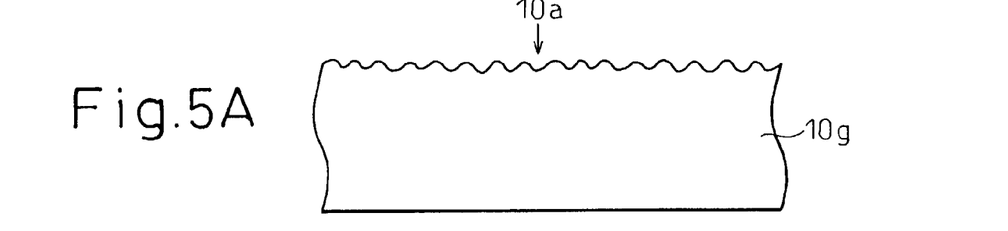
FIGS. 5A to 5D are schematic sectional views of a method of production of a circuit board according to a second embodiment of the present invention.

First, as shown in FIG. 5A, a quartz glass, high silicate glass, sapphire glass, or other glass substrate 10g is prepared as a type of substrate.

Step 2

Next, one surface 10a of the glass substrate 10g is roughened by for example treatment by hydrofluoric acid (HF). This treatment is performed in the same way as in the first embodiment so as to improve the bonding between the glass substrate and the layer formed on it by the anchor effect.

Step 3

Figure 5B:
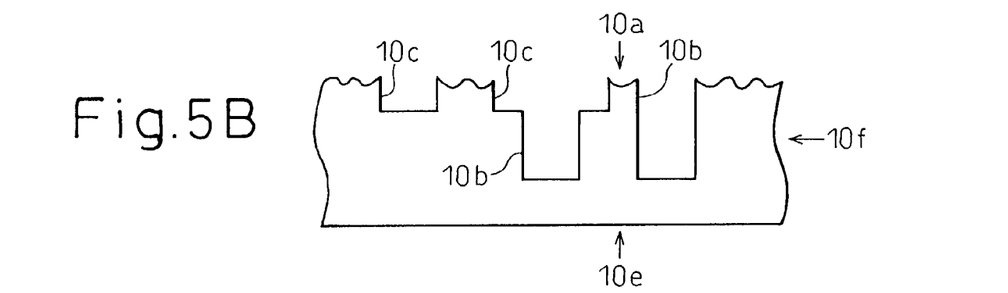

As shown in FIG. 5B, in the same way as in the first embodiment, holes 10b not passing through the glass substrate log are formed in one surface of the glass substrate 10b, then interconnect grooves 10c are formed. In this embodiment, the holes 10b and the interconnect grooves 10c can be formed by plasma etching, a $CO_2$ laser, or a YAG laser. Note that this step may be performed using treatment by caustic soda (NaOH), potassium hydroxide (KOH), or another strong alkali, sandblasting for blasting grains of sand by a high pressure, etc. At this time, in the same way as the first embodiment, dummy holes (not shown) are formed at areas of the glass substrate where the holes 10b and interconnect grooves 10c are not formed, for example, the periphery (corresponding to the part A of FIG. 1D).

Step 4

In this embodiment, since a glass substrate is used, the step for formation of the silicon oxide film is omitted.

Step 5

Next, using a similar method to the first embodiment, a plating power supply layer 14 comprised of an Ni layer 14a and an Au or Cu layer 14b is formed on the glass substrate 10g formed with the holes 10b and grooves 10c. Next, a first Cu layer 16 and second Cu layer 18 similar to the first embodiment are formed on the plating power supply layer 14 burying the holes 10b and grooves 10c by electroplating using the plating system 40 explained in the first embodiment. At this time, in the same way as the first embodiment, these layers are formed on the one surface and the other surface and sides of the glass substrate, that is, on the entire surface of the glass substrate.

Steps 6 and 7

Figure 5C:
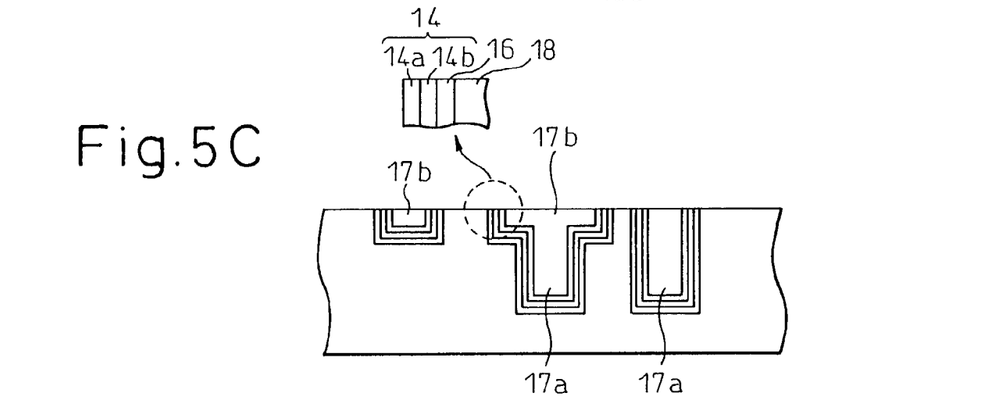

Next, as shown in FIG. 5C, a similar method as the method of production of the first embodiment is used to polish the first Cu layer 16, second Cu layer 18, Au layer 14b, and Ni layer 14a by CMP until the glass substrate is exposed so that the first Cu layer 16 and second Cu layer 18 are buried in the holes 10b and grooves 10c through the Ni layer 14a and Au layer 14b and so as to form the connection plugs 17a and interconnects 17b. At this time, in the same way as the first embodiment, since the first Cu layer 16 and second Cu layer 18 are formed as continuous films on the entire surface of the glass substrate 10g, of course no peeling of these layers occurs during the CMP.

Figure 5D:
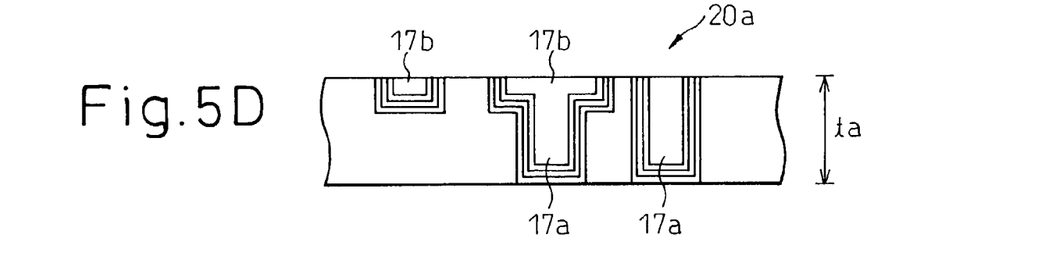

Next, the other surface 10e of the glass substrate 10g where the connection plugs 17a and interconnects 17b are not exposed is polished by back grinding in the same way as the first embodiment until the Ni layer 14a of the connection plugs 17a is exposed. Due to this, as shown in FIG. 5D, a circuit board 20a comprised of the glass substrate 10g formed with the connection plugs 17a and the interconnects 17b is formed. At this time, the polishing is preferably performed to obtain a thickness ta of the circuit board 20a of 30 to 500 μm.

Method of Mounting Semiconductor Chip on Circuit Board

A similar method to the first and second mounting methods explained in the first embodiment can be used to mount a semiconductor chip etc. on a circuit board 20a produced by the method of production of the second embodiment. This modification will be explained next.

FIGS. 6A to 6D are schematic sectional views of steps for mounting a semiconductor chip on a circuit board produced by the method of production of a circuit board of the second embodiment.

Figure 6A:
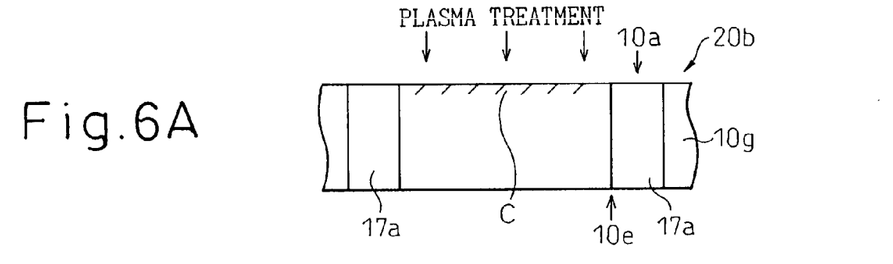
FIGS. 6A to 6D are schematic sectional views of a method of mounting a semiconductor chip on a circuit board produced by the method of production of a circuit board of a second embodiment of the present invention.

First, as shown in FIG. 6A, a circuit board 20b produced by the method of production of a circuit board of the present embodiment is prepared. Note that the sectional view of the circuit board 20b shown in FIG. 6A shows the section of the portion different from the circuit board 20a shown in FIG. 5D.

Next, one surface 10a of the circuit board 20b is activated by plasma treatment. Due to this, the portion close to the plasma treated glass surface of the circuit board 20b (portion C shown by hatching in FIG. 6A) is given reactive radicals.

Figure 6B:
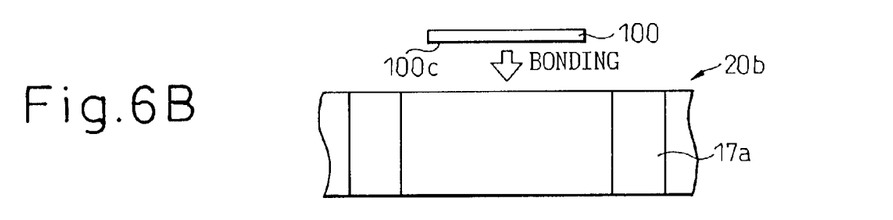

Next, as shown in FIG. 6B, a semiconductor chip 100 having a thickness of to 10 μm and formed with predetermined elements is prepared. The activated surface of the circuit board 20b and the back surface 100a of the semiconductor chip 100 (surface not formed with elements) are bonded together. This is achieved by bonding utilizing the Coulomb force acting between the radicals (negative charges) occurring at the portion C close to the surface of the glass of the circuit board 20b and for example the Si atoms forming the semiconductor chip 100.

Figure 6C:
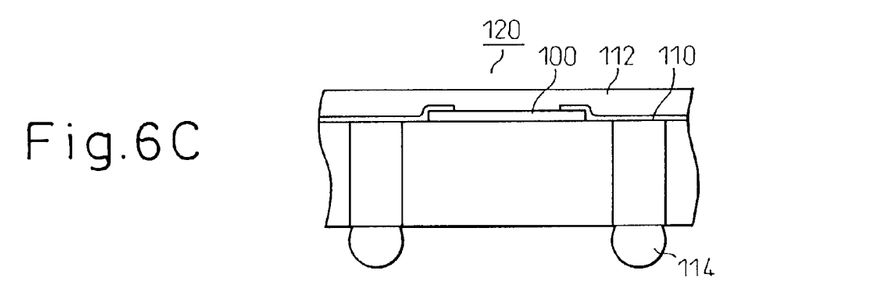

Next, as shown in FIG. 6C, a metal layer comprised of Cu, Al, Au, Cr, etc. is formed by sputtering on the circuit board 20b and the semiconductor chip 100. This metal layer is connected with the connection plugs 17a of the circuit board 20b and the electrode pads of the semiconductor chip 100 and patterned to form the interconnect patterns 110.

Next, a protective film (insulating film) 112 is formed to cover the semiconductor chip 100 and the interconnect pattern 110. As this protective film 112, it is possible to use a phosphosilicate glass (PSG) film or $SiO_2$ film formed by CVD or also a polyimide resin, epoxy resin, etc.

Next, metal bumps 114 comprised of Au, Ag, etc. are mounted on the connection plugs 17a exposed at the other surface 10e of the circuit board 20b.

At the stage when this step is ended, while not particularly shown, a plurality of semiconductor chips 100 are formed on a single circuit board 20b. That is, next, the circuit board 20b on which the plurality of semiconductor chips 100 are mounted is diced to produce a plurality of semiconductor devices (120 . . . )

Figure 6D:
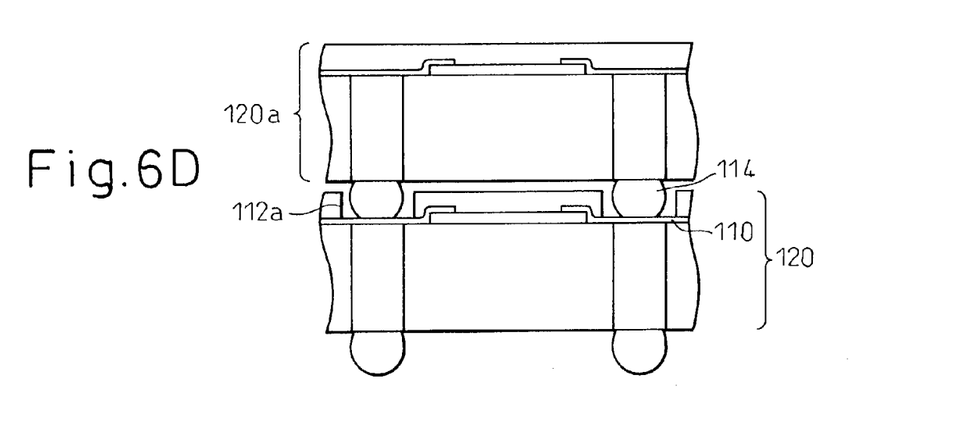

Note that as shown in FIG. 6D, since one semiconductor device 120 has another semiconductor device 120a electrically connected to and stacked on it, predetermined areas of the protective film 112 are patterned to form the openings 112a for exposing predetermined interconnect patterns of the first semiconductor device 120 before dicing the circuit board 20b. Further, as shown in the same FIG. 6D, it is possible to bond the interconnect patterns 110 of the first semiconductor device 120 with the metal bumps 114 of the other semiconductor device 120a to stack a plurality of semiconductor devices vertically and obtain a three-dimensional mounting structure or to use these semiconductor devices (120 . . . ) as single units.

While the invention was explained in detail above by the first and second embodiments, the scope of the invention is not limited to the examples specifically shown in the above embodiments. Modifications of the embodiments within a range not exceeding the gist of the present invention are included in the scope of the invention.

For example, as the plating power supply layer, the case was shown of formation of both an Ni layer 14a and Au layer 14b over the entire surface of the substrate, but it is sufficient to form just one of the Ni layer 14a and Au layer 14b on the entire surface of the substrate. That is, it is sufficient to enable the formation of the first Cu layer 16 and second Cu layer 18 over the entire surface of the substrate by electroplating.

As explained above, according to the present invention, by forming holes in one surface of the substrate, forming a metal layer forming a continuous film over that one surface of the substrate, the other surface and sides, and the inner surfaces of the holes, that is, over the entire surface of the substrate, by electroplating through the plating power supply layer, and polishing the metal layer, interconnects are formed burying the metal layer in the holes.

By forming a metal layer forming a continuous film over the entire surface of the substrate, there are no longer portions where the underlying plating power supply layer is exposed, that is, there are no longer portions where the interface between the metal layer and the plating power supply layer is exposed. Therefore, when polishing the metal layer by for example CMP, it is possible to prevent peeling of the metal layer caused by the polishing material used in the CMP invading the interface.

Further, in a preferable embodiment, in the step of forming the metal layer, an electrode chuck is connected for supplying current to the plating power supply layer of the substrate and the position at which the electrode chuck is connected is changed during the plating.

According to the present invention, since plating is performed while changing the position where the power supply electrodes contact the plating power supply layer during the plating, there are no longer any portions not formed with the metal layer due to contact with the power supply electrodes and a continuous film without breaks is formed over one surface and the other surface and sides of the substrate. Due to this, it is possible to prevent peeling of the metal layer due to contact of the power supply electrodes with the substrate.

While the invention has been described with reference to specific embodiments chosen for purpose of illustration, it should be apparent that numerous modifications could be made thereto by those skilled in the art without departing from the basic concept and scope of the invention.

The present disclosure relates to subject matter contained in Japanese Patent Application No. 2001-151027, filed on May 21, 2001, the disclosure of which is expressly incorporated herein by reference in its entirety.

The invention claimed is:

1. A method of production of a circuit board, including:
    forming a plurality of holes in a first surface of a substrate;
    forming a plating power supply layer on the first surface, a second surface and sides of the substrate, and inner surfaces of the holes by electroless plating;
    forming a metal layer formed on the first surface, the second surface and sides of the substrate and burying the holes, by electroplating through the plating power supply layer; and
    polishing the metal layer to form interconnect patterns comprised of the metal layer buried in the holes.

2. The method of production of a circuit board as set forth in claim 1, wherein the step of forming the metal layer is performed by connecting a power supply electrode for supplying plating current to the plating power supply layer to the plating power supply layer and changing the position of the connection of the power supply electrode.

3. The method of production of a circuit board as set forth in claim 1, further having a step of roughening the first surface of the substrate before the step of forming the holes in the substrate.

4. The method of production of a circuit board as set forth in claim 1, wherein the step of forming the holes in the substrate includes a step of forming dummy holes at least at a periphery of said substrate.

5. The method of production of a circuit board as set forth in claim 1, wherein said substrate is a silicon substrate and said method further includes a step of forming a silicon oxide film on at least the first surface and inner surface of the holes of the silicon substrate after the step of forming the holes in the substrate and before the step of forming the plating power supply layer.

6. The method of production of a circuit board as set forth in claim 1, wherein said substrate is a glass substrate.

7. The method of production of a circuit board as set forth in claim 1, wherein said plating power supply layer is comprised of a nickel (Ni) layer and a gold (Au) layer in that order from a plating substrate.

* * * * *

UNITED STATES PATENT AND TRADEMARK OFFICE
CERTIFICATE OF CORRECTION

PATENT NO. : 7,114,251 B2  Page 1 of 1
APPLICATION NO. : 10/145021
DATED : October 3, 2006
INVENTOR(S) : Naohiro Mashino It is certified that error appears in the above-identified patent and that said Letters Patent is hereby corrected as shown below:

Title Page, Column 1 (Title), item 54 change "METHOD OF PRODUCING OF CIRCUIT BOARD; FOR SEMICONDUCTOR DEVICE" to -- METHOD OF PRODUCING CIRCUIT BOARD FOR SEMICONDUCTOR DEVICE--.

Column 1, Line 1-2 (Title), change "METHOD OF PRODUCING OF CIRCUIT BOARD; FOR SEMICONDUCTOR DEVICE" to -- METHOD OF PRODUCING CIRCUIT BOARD FOR SEMICONDUCTOR DEVICE--.

Column 5, Line 13, change "10c" to --10c,--.
Column 5, Line 23, change "10c" to --10c,--.
Column 8, Line 31, change "film," to --film--.
Column 8, Line 51-52, change "anistropic" to --anisotropic--.
Column 10, Line 53, change "log" to --10g--.
Column 12, Line 20, after "(120...)" insert --.--.
Column 14, Line 2, after "wherein the" delete "step of".
Column 14, Line 9, after "claim 1, further" change "having a step of" to --comprising--.
Column 14, Line 10, after "before the" delete "step of".
Column 14, Line 10, after "forming" insert --of--.
Column 14, Line 13, after "wherein the" delete "step of".
Column 14, Line 14, after "includes" delete "a step of".
Column 14, Line 19, change "includes a step of" to --comprises--.
Column 14, Line 21, after "after the" delete "step of".
Column 14, Line 22, after "before" delete "the step of".

Signed and Sealed this

Twenty-second Day of January, 2008

JON W. DUDAS
*Director of the United States Patent and Trademark Office*